(12) United States Patent  
Aoto et al.

(10) Patent No.: US 10,153,138 B2  
(45) Date of Patent: Dec. 11, 2018

(54) PLASMA ETCHING APPARATUS

(71) Applicant: TOKYO ELECTRON LIMITED, Tokyo (JP)

(72) Inventors: Tadashi Aoto, Miyagi (JP); Daisuke Hayashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1106 days.

(21) Appl. No.: 14/019,023

(22) Filed: Sep. 5, 2013

(65) Prior Publication Data

US 2014/0069585 A1 Mar. 13, 2014

Related U.S. Application Data

(60) Provisional application No. 61/700,036, filed on Sep. 12, 2012.

(30) Foreign Application Priority Data

Sep. 7, 2012 (JP) .................. 2012-197556

(51) Int. Cl.
*H01L 21/687* (2006.01)
*H01J 37/32* (2006.01)
*H01L 21/683* (2006.01)
*H01L 21/67* (2006.01)

(52) U.S. Cl.
CPC .. *H01J 37/32715* (2013.01); *H01J 37/32091* (2013.01); *H01L 21/6831* (2013.01); *H01L 21/68757* (2013.01); *H01J 37/32807* (2013.01); *H01L 21/67103* (2013.01)

(58) Field of Classification Search
CPC ............ H01L 21/6831; H01L 21/6833; H01L 21/68757; H01L 21/68742; C23C 16/4586

See application file for complete search history.

(56) References Cited

U.S. PATENT DOCUMENTS 5,055,964 A * 10/1991 Logan ................. H01L 21/6831
                                                    279/128
5,625,526 A * 4/1997 Watanabe ............... G03F 7/707
                                                    361/234
5,740,009 A * 4/1998 Pu ....................... H01L 21/6831
                                                    361/234

(Continued)

FOREIGN PATENT DOCUMENTS

JP          06-283594 A     10/1994
JP          2006-140455 A    6/2006

(Continued)

*Primary Examiner* — Aiden Lee (74) *Attorney, Agent, or Firm* — Rothwell, Figg, Ernst & Manbeck, P.C.

(57) ABSTRACT

Disclosed is a plasma etching apparatus which includes: a base formed of a metal that has a lower expansion coefficient than aluminum; an electrostatic chuck disposed on a mounting surface of the base and configured to mount an object to be processed; a bonding layer which bonds the base to the electrostatic chuck; and a heater provided within the electrostatic chuck. In the plasma etching apparatus, the base is provided with a metal portion that is formed through a cold spraying by using a metal that has a higher thermal conductivity than the metal for forming the base.

17 Claims, 5 Drawing Sheets

(56) References Cited

U.S. PATENT DOCUMENTS

| | | | | |
|---|---|---|---|---|
| 5,886,863 A * | 3/1999 | Nagasaki | H01L 21/6831 | 279/128 |
| 5,978,202 A * | 11/1999 | Wadensweiler | H01L 21/6833 | 279/128 |
| 6,310,755 B1 * | 10/2001 | Kholodenko | C04B 35/185 | 361/115 |
| 6,503,368 B1 * | 1/2003 | Kholodenko | C23C 16/4581 | 118/500 |
| 6,646,233 B2 * | 11/2003 | Kanno | H01L 21/67109 | 118/724 |
| 7,265,962 B2 * | 9/2007 | Miyaji | H01L 21/6831 | 219/390 |
| 2001/0025691 A1 | 10/2001 | Kanno | H01J 37/321 | 156/345.28 |
| 2002/0036881 A1 * | 3/2002 | Shamouilian | C04B 35/185 | 361/234 |
| 2004/0261946 A1 * | 12/2004 | Endoh | H01J 37/32082 | 156/345.15 |
| 2006/0076108 A1 * | 4/2006 | Holland | H01L 21/67103 | 156/345.27 |
| 2006/0279899 A1 * | 12/2006 | Aihara | H01L 21/67109 | 361/234 |
| 2007/0042603 A1 * | 2/2007 | Kropewnicki | H01L 22/20 | 438/689 |
| 2009/0308537 A1 * | 12/2009 | Shibuya | C23C 14/50 | 156/345.35 |
| 2010/0122774 A1 * | 5/2010 | Makabe | H01J 37/32431 | 156/345.52 |
| 2011/0222038 A1 * | 9/2011 | Yamashita | C23C 16/4581 | 355/53 |
| 2011/0287631 A1 * | 11/2011 | Yamamoto | H01J 37/32568 | 438/710 |
| 2012/0118510 A1 * | 5/2012 | Banda | B32B 38/10 | 156/704 |

FOREIGN PATENT DOCUMENTS

| | | |
|---|---|---|
| JP | 2010-45170 A | 2/2010 |
| JP | 2010-205790 A | 9/2010 |
| JP | 2011-187758 A | 9/2011 |

* cited by examiner

PLASMA ETCHING APPARATUS

CROSS-REFERENCE TO RELATED APPLICATIONS

This application is based on and claims priority from Japanese Patent Application No. 2012-197556, filed on Sep. 7, 2012, with the Japan Patent Office, the disclosure of which is incorporated herein in its entirety by reference. Also, this application is based on and claims priority from U.S. Patent Provisional Application No. 61/700,036, filed on Sep. 12, 2012.

TECHNICAL FIELD

The present disclosure relates to a plasma etching apparatus.

BACKGROUND

A conventional plasma processing apparatus includes a bonding layer between a base (susceptor) and an electrostatic chuck, and the bonding layer bonds the base to the electrostatic chuck. As the bonding layer, an elastic body (e.g., adhesive) that extends up to a value or more of a thermal expansion or contraction amount of the base and the electrostatic chuck, is used. For example, ceramic is used for the electrostatic chuck, and aluminum is used for the base. See, for example, Japanese Patent Application No. H06-283594 and Japanese Patent Application No. 2011-187758.

SUMMARY

A plasma etching apparatus according to an aspect of the present disclosure includes a base formed of a metal that has a lower expansion coefficient than aluminum. The disclosed plasma etching apparatus includes an electrostatic chuck disposed on a mounting surface of the base and configured to mount an object to be processed. The disclosed plasma etching apparatus includes a bonding layer which bonds the base to the electrostatic chuck. The disclosed plasma etching apparatus includes a heater provided within the electrostatic chuck. In the plasma etching apparatus, in an exemplary embodiment, the base includes a metal portion that is formed through a cold spraying by using a metal that has a higher thermal conductivity than the metal for forming the base.

The foregoing summary of disclosure and the paragraph contents are illustrative only and not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the disclosure presented here.

The above described technology has a problem in that the bonding layer may be peeled off. For example, the temperature of a wafer is adjusted to a required temperature by increasing the temperature of a heater embedded in the electrostatic chuck, and decreasing the temperature of the base. In this case, the bonding layer is applied with a load caused by expansion or contraction due to a temperature difference between the base and the electrostatic chuck. Accordingly, when the temperature difference is greater than a value allowed for the bonding layer, the bonding layer may be peeled off.

The disclosed plasma etching apparatus includes a base formed of a metal that has a lower expansion coefficient than aluminum. The disclosed plasma etching apparatus includes an electrostatic chuck disposed on a mounting surface of the base and configured to mount an object to be processed. The disclosed plasma etching apparatus includes a bonding layer which bonds the base to the electrostatic chuck. The disclosed plasma etching apparatus includes a heater provided within the electrostatic chuck. In the plasma etching apparatus, in an exemplary embodiment, the base includes a metal portion that is formed through a cold spraying by using a metal that has a higher thermal conductivity than the metal for forming the base.

In the plasma etching apparatus described above, the bonding layer is formed of a brazing metal.

In the plasma etching apparatus described above, the base is provided with the metal portion at a position within the base below the electrostatic chuck.

The plasma etching apparatus described above further includes a focus ring, and the base is provided with the metal portion at a position within the base below the focus ring.

In the plasma etching apparatus described above, the base is provided with an outlet port of a terminal that is connected to an electrode plate or the heater provided within the electrostatic chuck, and the outlet port is provided with a ceramic layer formed through a plasma spraying, and a wiring having a metal portion formed through a cold spraying.

In the plasma etching apparatus described above, the metal for forming the base includes at least one of titanium, kovar, invar, super invar, and nobinite.

In the plasma etching apparatus described above, the metal that has the higher thermal conductivity includes at least one of silver, copper and aluminum.

In the plasma etching apparatus described above, the electrostatic chuck is formed of ceramic, and is provided with a metal film at a portion to which the bonding layer is bonded.

In the plasma etching apparatus described above, the metal portion is provided while being divided in plural portions.

In the plasma etching apparatus described above, the metal portion is provided in a larger amount at a position corresponding to an edge of the electrostatic chuck than at a position corresponding to a center of the electrostatic chuck within the base at a position below the electrostatic chuck.

In the plasma etching apparatus described above, the metal portion is provided only at a position corresponding to an edge of the electrostatic chuck, on a position below the electrostatic chuck.

In an aspect of the disclosed plasma etching apparatus described above, an effect of preventing the bonding layer from being peeled off may be achieved.

Hereinafter, exemplary embodiments of the disclosed plasma etching apparatus will be described in detail based on drawings. The disclosure is not limited to the exemplary embodiments. The respective exemplary embodiment may be appropriately combined with each other within a range not causing contradiction of processing details.

(First Exemplary Embodiment)

The plasma etching apparatus according to a first exemplary embodiment, as an exemplary embodiment, includes a base formed of a metal that has a lower expansion coefficient than aluminum, an electrostatic chuck which is disposed on a mounting surface of the base and configured to mount an object to be processed, a bonding layer which bonds the base to the electrostatic chuck, and a heater provided within the electrostatic chuck. In the plasma etching apparatus according to the first exemplary embodiment, as an exemplary embodiment, the base is provided with a metal portion that is formed through a cold spraying by using a metal that has a higher thermal conductivity than the metal for forming the base.

In the plasma etching apparatus according to the first exemplary embodiment, as an exemplary embodiment, the bonding layer is formed of a brazing metal.

In the plasma etching apparatus according to the first exemplary embodiment, as an exemplary embodiment, the base includes the metal portion at a position within the base below the electrostatic chuck.

In the plasma etching apparatus according to the first exemplary embodiment, as an exemplary embodiment, the metal for forming the base includes at least one of titanium, kovar, invar, super invar, and nobinite.

In the plasma etching apparatus according to the first exemplary embodiment, as an exemplary embodiment, the metal that has the higher thermal conductivity includes at least one of silver, copper and aluminum.

In the plasma etching apparatus according to the first exemplary embodiment, as an exemplary embodiment, the electrostatic chuck is formed of ceramic, and includes a metal film at a portion to which the bonding layer is bonded.

(Configuration of Plasma Etching Apparatus According to First Exemplary Embodiment)

Figure 1:
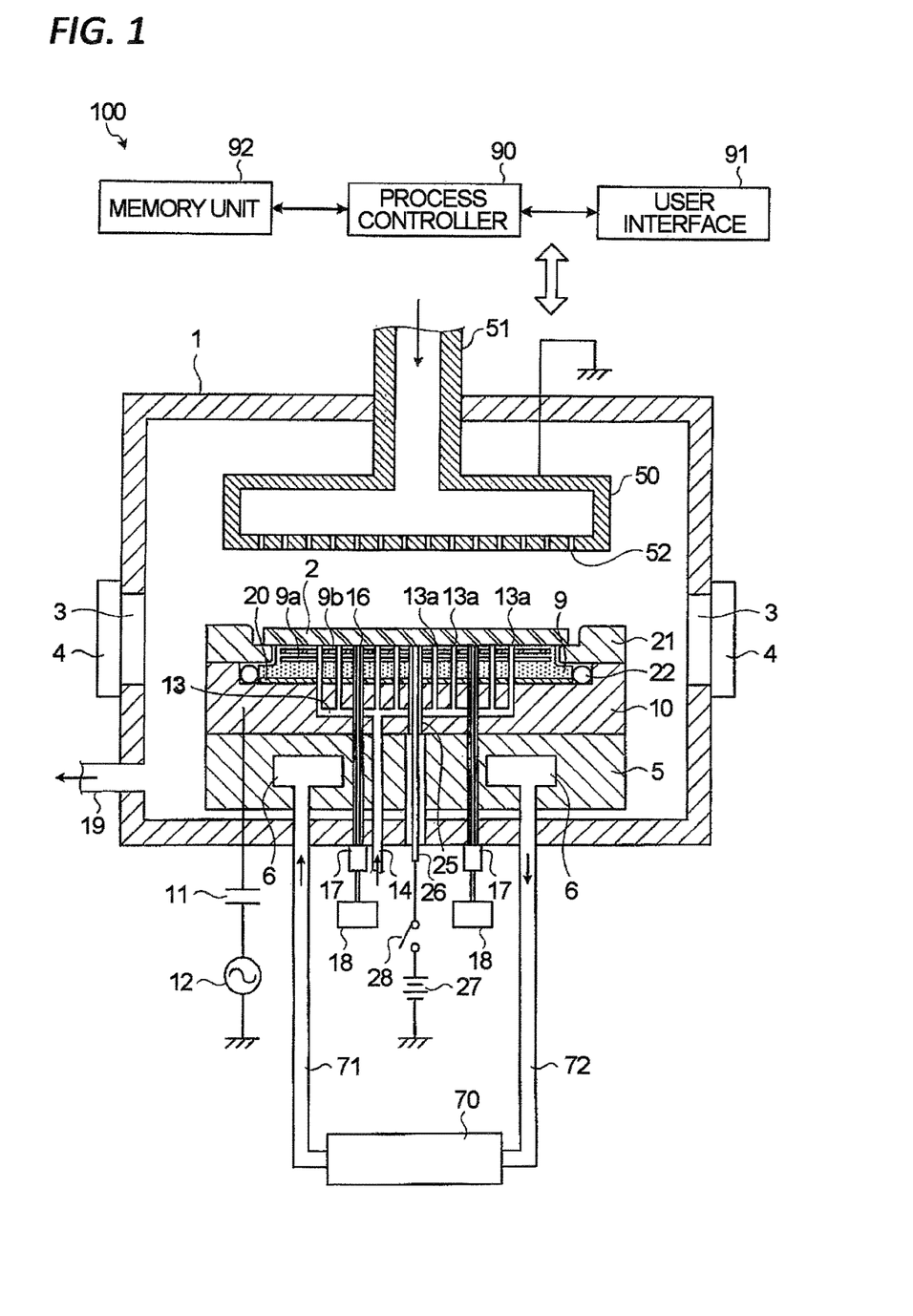
FIG. 1 is a cross-sectional view illustrating the overall configuration of a plasma etching apparatus according to a first exemplary embodiment.
Figure 2:
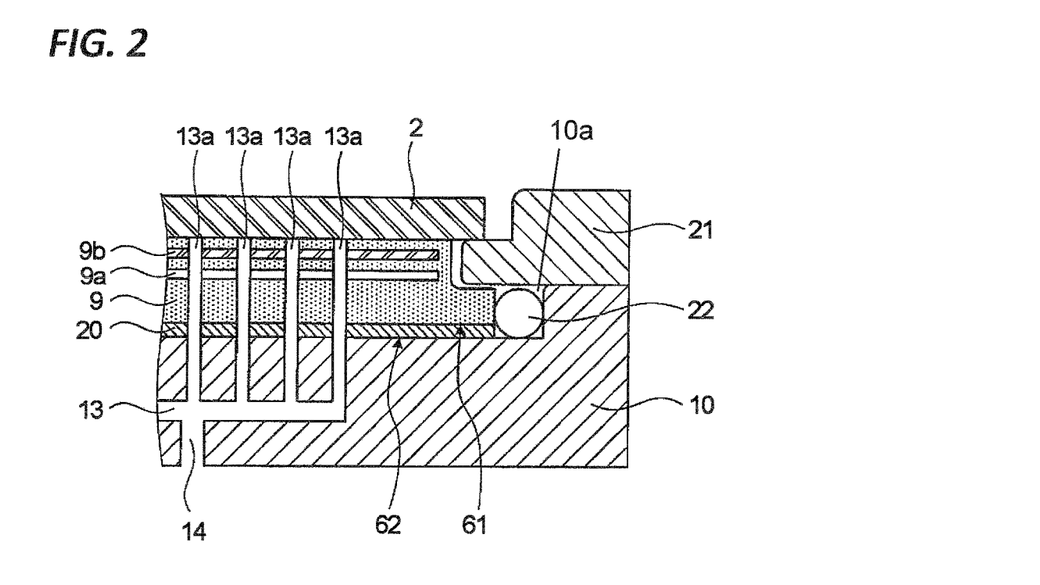
FIG. 2 is a cross-sectional view illustrating a positional relationship between a semiconductor wafer, an electrostatic chuck, a susceptor, a focus ring and a seal member in the first exemplary embodiment.

FIG. 1 is a cross-sectional view illustrating the overall configuration of a plasma etching apparatus according to a first exemplary embodiment. FIG. 2 is a cross-sectional view illustrating a positional relationship between a semiconductor wafer, an electrostatic chuck, a susceptor, a focus ring and a seal member in the first exemplary embodiment.

As illustrated in FIG. 1, a plasma etching apparatus 100 includes a chamber 1. The chamber 1 is formed of conductive aluminum at an outer wall portion. In the example illustrated in FIG. 1, the chamber 1 includes an opening 3 through which a semiconductor wafer 2 is carried in/out to or from the chamber 1, and a gate valve 4 that is capable of opening and closing through an airtightly sealing body. The sealing body is, for example, an O ring.

Although not illustrated in FIG. 1, a load lock chamber is continuously provided in the chamber 1 via the gate valve 4. A conveying device is provided in the load lock chamber. The conveying device carries the semiconductor wafer 2 into/from the chamber 1.

The chamber 1 includes an exhaust port 19 that is opened at the side wall bottom portion to decompress the inside of the chamber 1. The exhaust port 19 is connected to a vacuum exhaust device (not illustrated) via an open/close valve, for example, a butterfly valve. The vacuum exhaust device is, for example, a rotary pump or a turbo molecular pump.

As illustrated in FIG. 1, the plasma etching apparatus 100 includes a base support member 5 at the bottom central portion within the chamber 1. The plasma etching apparatus 100 includes a base 10 at the top of the base support member 5. As illustrated in FIGS. 1 and 2, the plasma etching apparatus 100 includes an electrostatic chuck 9 at the top of the base 10. Further, the plasma etching apparatus 100 includes a focus ring 21 that is provided at the top of the base 10 to surround the electrostatic chuck 9.

Figure 3:
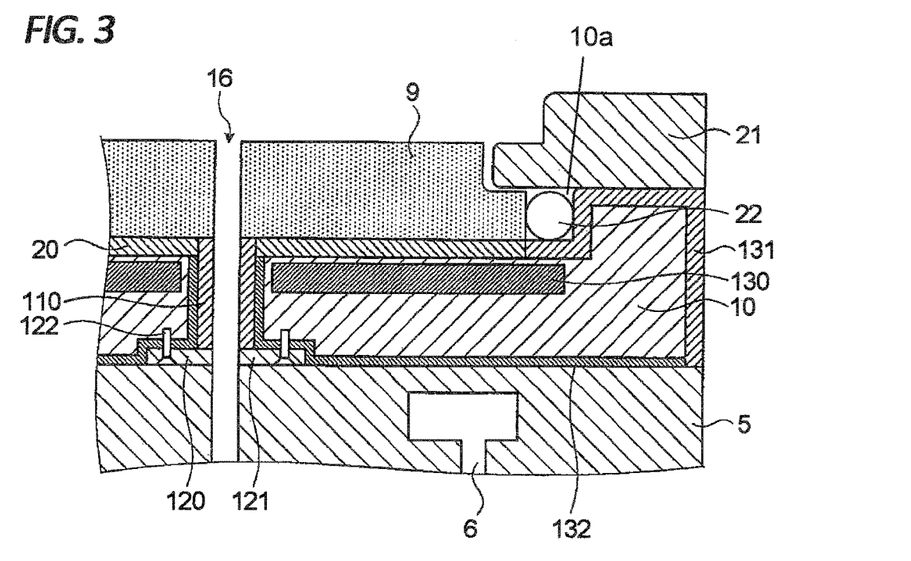
FIG. 3 is a cross-sectional view illustrating details of a base, a bonding layer, and an electrostatic chuck in the first exemplary embodiment.
Figure 4:
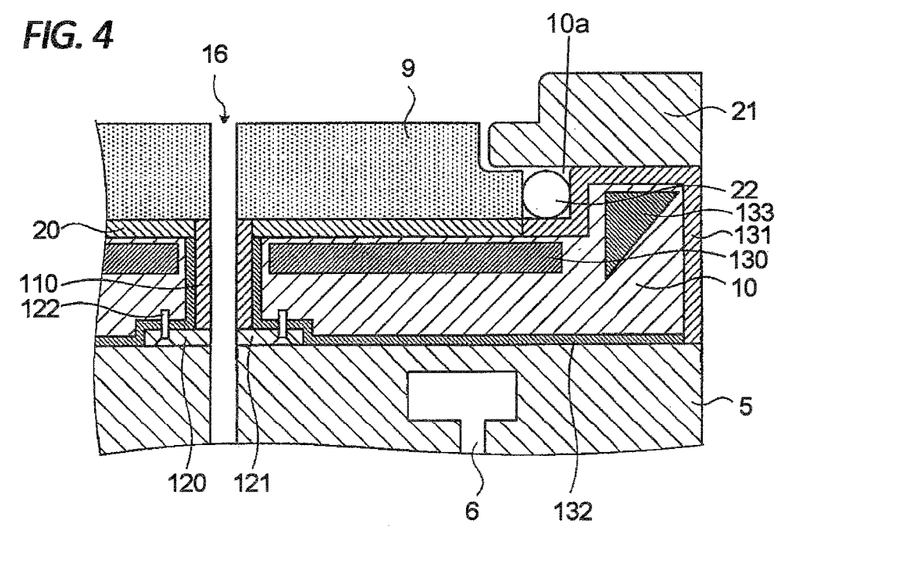
FIG. 4 is a cross-sectional view illustrating details of a base, a bonding layer, and an electrostatic chuck in a second exemplary embodiment.

As illustrated in FIGS. 1 and 2, the peripheral portion of the base 10 is higher than a position where the electrostatic chuck 9 is provided. Hereinafter, the portion that is higher than the position where the electrostatic chuck 9 is provided will be referred to as a peripheral convex portion. As shown in FIG. 2, with this peripheral convex portion, a cylindrical recess 10*a* is provided on the base. In addition, as shown in FIGS. 3 and 4, a metal portion 130 (discussed in further detail hereinafter) is embedded in the base 10 at a location below the recess 10*a*. As illustrated in FIG. 2, there is a seal member 22 that is in contact with at least two of the side surface of the electrostatic chuck 9, the peripheral convex portion of the base 10, and the bottom of the susceptor. The seal member 22 is, for example, an O ring.

The plasma etching apparatus 100 includes an upper electrode 50 above the base 10 and at an upper portion of the chamber 1. The upper electrode 50 is electrically grounded. A processing gas is supplied to the upper electrode 50 through a gas supply pipe 51, and is released from a plurality of radial small holes 52 perforated in the bottom wall of the upper electrode 50 toward the semiconductor wafer 2. Here, when a high frequency power source 12 is turned ON, plasma caused by the released processing gas is generated between the upper electrode 50 and the semiconductor wafer 2. The processing gas is, for example, $CHF_3$, or $CF_4$.

Here, respective units of the plasma etching apparatus 100 will be further described. The base support member 5 is cylindrically formed of a conductive member such as, for example, aluminum. The base support member 5 includes a coolant jacket 6 provided therewithin, in which a cooling medium is kept within the coolant jacket 6. The coolant jacket 6 is provided with a flow path 71 and a flow path 72 which airtightly penetrate the bottom of the chamber 1. The flow path 71 is configured to introduce the cooling medium into the coolant jacket 6, and the flow path 72 is configured to discharge the cooling medium.

In the example to be described below, the coolant jacket 6 is provided within the base support member 5, but the present disclosure is not limited thereto. For example, the coolant jacket 6 may be provided within the base 10. The coolant jacket 6, as described below, controls the temperature of the base 10 or the base support member 5 while the cooling medium is circulated by a chiller 70.

The base 10 is connected to the high frequency power source 12 via a blocking condenser 11. The base 10 is attached to the base support member 5 by bolts (not illustrated). The base 10 is cooled while the coolant of the coolant jacket 6 is conducted to the base 10 through the base support member 5. The frequency of the high frequency power source 12 is, for example, 13.56 MHz or 40 MHz.

As illustrated in FIGS. 1 and 2, the base 10 is bonded to the electrostatic chuck 9 by a bonding layer 20. The electrostatic chuck 9 is made of, for example, ceramic (a coefficient of linear thermal expansion; about $7.1 \times 10^{-6}$ (cm/cm/°)). The electrostatic chuck 9 includes an electrode plate 9b and a heater 9a therewithin. On the top surface of the electrostatic chuck 9, the semiconductor wafer 2 is mounted.

As illustrated in FIG. 1, the electrode plate 9b is connected to one end side of a conductive wire 25, and the other end side of the conductive wire 25 is connected to a power feeding rod 26. The circumference of the conductive wire 25 is covered with an insulating member such as, for example, Teflon (registered trademark), embedded within the base 10. The power feeding rod 26 is formed of, for example, copper, to feed a high voltage ranging from 200 V to 3 kV. The power feeding rod 26 airtightly and insulatively penetrates the bottom of the chamber 1 to be connected to a high voltage power source 27 via an electromagnetic switch 28. The electromagnetic switch 28 is turned ON or OFF by a control signal which controls the apparatus (not illustrated).

A through hole 16 is provided in each of the base 10, the base support member 5, the bonding layer 20, and the electrostatic chuck 9. A pusher pin 15 that is electrically grounded through resistance or inductance is provided within the through hole 16. The pusher pin 15 is connected to an air cylinder 18 which is a vertical moving module, via a bellows 17 that places the chamber 1 in an airtight state, and at the same time, enables the chamber 1 to stretch. The pusher pin 15 is moved up or down by the air cylinder 18 when the semiconductor wafer 2 comes in contact with the electrostatic chuck 9 or is separated from the electrostatic chuck 9 through delivery of the semiconductor wafer 2 from the conveying device of the load lock chamber.

A plurality of through holes 13a configured to uniformly supply a heat transfer medium to the rear surface of the semiconductor wafer 2 are provided in the base 10 and the electrostatic chuck 9. The through holes 13a are connected to a gas reservoir 13 configured to make the pressure of He gas applied to the through holes 13a uniform. The gas reservoir 13 is connected to a supply pipe 14 configured to introduce the heat transfer medium from the outside of the chamber 1. The heat transfer medium is, for example, He gas serving as an inert gas. However, the present disclosure is not limited thereto, and any gas may be used.

As illustrated in FIG. 1, the plasma etching apparatus 100 includes the chiller 70 that circulates the cooling medium in the coolant jacket 6. Specifically, the chiller 70 transmits the cooling medium to the coolant jacket 6 through the flow path 71, and receives the cooling medium coming out from the coolant jacket 6 through the flow path 72.

(Base, Bonding Layer, and Electrostatic Chuck)

FIG. 3 is a cross-sectional view illustrating details of the base, the bonding layer, and the electrostatic chuck in the first exemplary embodiment. In the example illustrated in FIG. 3, for convenience of illustration, the electrostatic chuck 9, the seal member 22, the through hole 16, an elastic member 110, and a biasing member 120 are also illustrated. In the example illustrated in FIG. 3, for convenience of illustration, illustration of the through holes 13a, the gas reservoir 13, and the supply pipe 14 is omitted.

The elastic member 110 is pressed against the bottom surface of the electrostatic chuck 9. That is, a portion of the bottom surface of the electrostatic chuck 9 against which the elastic member 110 is pressed is not provided with the bonding layer 20. As a result, the bonding layer 20 is not exposed at the through hole 16. The elastic member 110 is formed of, for example, fluorine rubber.

The biasing member 120 applies a press force from the base 10 side to the electrostatic chuck 9 side, to the elastic member 110. In the example illustrated in FIG. 3, the biasing member 120 includes a plate-shaped member 121 that is in contact with the bottom of the elastic member 110, and a screw member 122 that connects the plate-shaped member 121 to the base 10. The plate-shaped member 121 is formed of, for example, ceramic. However, the present disclosure is not limited thereto. For example, the plate-shaped member 121 may be formed of the same material as that of the elastic member 110.

In the example illustrated in FIG. 3, the screw member 122 of the biasing member 120 is fitted into a threaded hole provided in the base 10, thereby connecting the plate-shaped member 121 to the base 10. Here, the plate-shaped member 121 gives a press force toward the electrostatic chuck 9 side, to the elastic member 110, and is connected to the base 10 by the screw member 122, thereby continuously giving the press force toward the electrostatic chuck 9 side, to the elastic member 110.

In the first exemplary embodiment, the base 10 is formed of a material that has a lower coefficient of thermal expansion than aluminum. For example, the base 10 may be formed of a material that has the same coefficient of thermal expansion as a material for the electrostatic chuck 9. The metal for forming the base 10 includes, for example, at least one of titanium, kovar, invar, super invar, and nobinite.

As illustrated in FIG. 3, the base 10 includes a metal portion 130 that is formed through a cold spraying by using a metal that has a higher thermal conductivity than the metal for forming the base 10. The metal that has a higher thermal conductivity includes at least one of silver, copper and aluminum.

For example, the base 10 includes the metal portion 130 at a position within the base 10 below the electrostatic chuck 9. For further detailed description, the metal portion 130 formed of the metal such as, for example, silver or copper is formed on the base 10 within a cylindrical groove provided in the base 10 through a cold spraying, and then, the metal layer formed of the metal for forming the base 10 is formed on the metal portion 130 through a cold spraying. That is, the metal portion 130 is formed within the hole provided in the base 10, and then is covered. As a result, the metal portion 130 is formed within the base 10. However, the formation of the metal portion 130 is not limited to this technique, and any other technique may be used.

Here, the cold spraying is a technique of forming a film by accelerating a working gas heated up to a temperature that is lower than a melting point or a softening temperature of spraying powder, to a supersonic speed, and colliding the spraying powder in a solid state with a substrate at a high speed by using the accelerated working gas. In a case of a spraying process performed at a relatively high temperature, in general, spraying powder heated up to a temperature that is equal to or greater than a melting point or a softening temperature is sprayed on a substrate. As a result, there is a disadvantage in that the substrate may be thermally deteriorated or deformed according to the material or shape of the substrate, and a film may not be formed on some materials or shapes of substrates, and the material and the shape of the substrate may be limited. Further, in the spraying process, since the spraying powder requires to be heated to a temperature that is equal to or greater than a melting point or a softening temperature, an apparatus may be large-sized, and thus the conditions such as a construction site may be limited. In contrast, in the cold spraying, spraying is performed at a relatively low temperature, and thus, the substrate is hardly thermally deteriorated or deformed. Further, in the cold spraying, an apparatus needs to have only a small size as compared to that in the spraying process performed at a relatively high temperature in order to solve the problems described above. Since the working gas used in the cold spraying is not a combustion gas, the safety is excellent, and the convenience in on-site construction is improved.

The cold spraying may be performed under the following conditions. A compressed air is mainly used as a working gas, and the working gas is heated up to a working gas temperature of 500° C. at 1 MPa. The spraying powder is supplied to the working gas, at a feed rate of 10 g/min in the coaxial direction of the working gas. In the cold spraying, a distance from a nozzle front end for a cold spraying to a substrate is 40 mm. The traverse speed of a nozzle for a cold spraying may be set to be 20 mm/sec. As the spraying powder, a commercially available cold spray may be used. However, the above described conditions are exemplary only, and the present disclosure is not limited thereto. Any other condition may be employed.

The thickness of the metal portion 130 ranges from 0.5 mm to 1 mm when the metal portion 130 is formed of, for example, copper. However, the present disclosure is not limited thereto, and other thicknesses may be employed.

Since the metal portion 130 is embedded within the base 10 in this manner, the metal used for forming the metal portion 130 may be securely prevented from being released to the inside of the chamber.

The bonding layer 20 not only serves a role for relaxing stress between the electrostatic chuck 9 and the base 10, but also bonds the base 10 to the electrostatic chuck 9. The bonding layer 20 may be referred to as a "metalized layer". The bonding layer 20 is formed of a brazing metal. The brazing metal is formed of a metal that has a lower coefficient of thermal expansion than aluminum. For example, the brazing metal is a mixture of an alloy of silver, copper, and titanium with wax, or a mixture of an alloy of gold, copper, and titanium with wax. However, this is exemplary only, and the present disclosure is not limited thereto.

As described above, the base 10 is formed of a material that has a lower coefficient of thermal expansion than aluminum. As a result, as compared to another plasma etching apparatus employing a base 10 formed of aluminum, the plasma etching apparatus according to the first exemplary embodiment has a smaller difference in thermal conductivity between the base 10 and the electrostatic chuck 9. As a result, even when the electrostatic chuck 9 is heated, or the base 10 is cooled by the coolant jacket 6, a difference between expansion of the electrostatic chuck 9 and contraction of the base 10 is reduced as compared to in the plasma etching apparatus employing the base 10 formed of aluminum. Accordingly, the bonding layer 20 may be formed of a material that has a lower coefficient of thermal expansion than in the plasma etching apparatus employing the base 10 formed of aluminum. For example, as described above, the bonding layer 20 formed of a brazing metal may be used.

The electrostatic chuck 9 is formed of ceramic such as, for example, $Al_2O_3$ or $Y_2O_3$, and includes a metal film at its portion bonded to the bonding layer 20. The metal film provided on the bottom surface of the electrostatic chuck 9 allows the electrostatic chuck 9 and the bonding layer 20 to be easily bonded to each other.

Here, an example of a method for bonding the electrostatic chuck 9 and the bonding layer 20 to the base 10 will be described. For example, a plating layer of nickel is made on the bottom surface of the bonding layer 20, and the top surface of the base 10, and then the bonding layer 20 is bonded to the base 10. The metal film is formed on the bottom surface of the electrostatic chuck 9 and the top surface of the bonding layer 20, and then the bottom surface of the electrostatic chuck 9 is bonded to the top surface of the bonding layer 20. At the time of bonding, the bonding is performed in such a manner that a sheet-type wax made of, for example, silver and copper, or silver and germanium is sandwiched, and heated. As described above, based on the fact that the base 10 is formed of a material that has a lower coefficient of thermal expansion than aluminum, the base 10 and the electrostatic chuck 9 are fixed by the metalized layer.

The base 10 includes a sprayed film 131 and an insulating film 132. The sprayed film 131 is formed of, for example, film 131. The sprayed film 131 is formed of, for example, $Al_2O_3$ or $Y_2O_3$. The sprayed film 131 covers the surface of the base 10 such that the base 10 is not exposed to the inside of the chamber. The insulating film 132 is formed by, for example, fluorine resin coating.

As described above, the plasma etching apparatus 100 according to the first exemplary embodiment includes: the base 10 which is formed of a metal that has a lower expansion coefficient than aluminum; the electrostatic chuck 9 which is disposed on the mounting surface of the base 10 and configured to mount an object to be processed; the bonding layer 20 which bonds the base 10 to the electrostatic chuck 9; and the heater 9a provided within the electrostatic chuck 9. The base 10 includes the metal portion 130 that is formed through a cold spraying using a metal that has a higher thermal conductivity than the metal for forming the base 10. As a result, the bonding layer 20 may be prevented from being peeled off. That is, since the difference in the coefficient of thermal expansion between the base 10 and the electrostatic chuck 9 is decreased, the stress applied to the bonding layer 20 may be decreased, thereby preventing the bonding layer 20 from being peeled off.

That is, in a plasma etching apparatus provided with an electrostatic chuck embedded with a heater and a lower electrode that consists of a base 10 having a cooling function caused by a coolant jacket, a force due to heat, such as expansion and contraction, is generated by the heating of the heater, and the cooling of the base. As a result, the bonding layer between the electrostatic chuck and the base may be peeled off, causing a problem in that the plasma etching apparatus cannot be used for a long time.

In a case where aluminum (expansion coefficient: 23.5 ($\times 10^{-6}$/° C.), and thermal conductivity: about 200 (W/mk)) is used for the base, when aluminum having a relatively high expansion coefficient is used, the thermal conductivity of aluminium becomes also high. Based on this, as described above, in the first exemplary embodiment, the base 10 is formed of a metal that has a lower expansion coefficient than aluminum. For example, when the base 10 is formed of titanium, kovar, invar, super invar, or nobinite, the base has a smaller expansion coefficient than aluminum (titanium: 8.9 ($\times 10^{-6}$/° C.), kovar: 5.2 ($\times 10^{-6}$/° C.), invar: from 0.5 to 2

($\times 10^{-6}/^\circ$ C.), super invar: from 0 to 1.5 ($\times 10^{-6}/^\circ$ C.), and nobinite: from 1 to 2 ($\times 10^{-6}/^\circ$ C.). The ceramic material for the electrostatic chuck 9, that is, $Al_2O_3$, or $Y_2O_3$, has an expansion coefficient of about 7 ($\times 10^{-6}/^\circ$ C.), and its expansion coefficient is also smaller like the base 10. As a result, the amount of each of expansion or contraction caused by a temperature difference between the electrostatic chuck 9 and the base 10 is decreased. As a result, a load that is applied to the bonding layer 20 that bonds the electrostatic chuck 9 to the base 10 may be reduced, thereby preventing the bonding layer from being peeled off.

When the base 10 is formed of a metal that has a lower expansion coefficient than aluminum, the thermal conductivity is decreased as compared to when it is formed of aluminum. For example, when the base 10 is formed of, for example, titanium, kovar, invar, super invar, or nobinite, the thermal conductivity of the base is at least 10% or less of the case employing aluminum. Based on this, as described above, in the first exemplary embodiment, the base 10 has, therewithin, the metal portion 130 formed of a material that has a higher thermal conductivity than the material for the base 10. As a result, the thermal conductivity of the base 10 may be improved.

In the first exemplary embodiment, the bonding layer 20 is formed of a brazing metal. That is, as described above, as compared to the case of employing aluminum, the coefficient of thermal expansion of the base 10 becomes closer to the coefficient of thermal expansion of the electrostatic chuck 9, and the base 10 and the electrostatic chuck 9 may be strongly bonded using the brazing metal.

In the first exemplary embodiment, the base 10 is provided with the metal portion 130 at a position within the base 10 below the electrostatic chuck 9. As a result, the heat of the electrostatic chuck 9 may be efficiently transferred into the base 10 side.

In the first exemplary embodiment, the metal for forming the base 10 includes at least one of titanium, kovar, invar, super invar, and nobinite. As a result, the coefficient of thermal expansion of the base 10 may have a relatively low value as compared to that of aluminum.

In the first exemplary embodiment, the metal that has a higher thermal conductivity includes at least one of silver, copper and aluminum. As a result, the coefficient of thermal expansion of the metal portion 130 may be increased.

In the first exemplary embodiment, the electrostatic chuck 9 is formed of ceramic, and includes the metal film at its portion bonded to the bonding layer 20. As a result, the electrostatic chuck 9 formed of ceramic, and the bonding layer 20 may be securely adhered.

(Second Exemplary Embodiment)

A plasma etching apparatus according to a second exemplary embodiment will be described. Hereinafter, the descriptions of the same features as those in the plasma etching apparatus 100 according to the first exemplary embodiment will be omitted.

The plasma etching apparatus according to the second exemplary embodiment includes a focus ring 21. In the plasma etching apparatus, a base 10 is provided with a metal portion at a position within the base 10 below the focus ring 21.

FIG. 4 is a cross-sectional view illustrating details of the base, the bonding layer, and the electrostatic chuck in the second exemplary embodiment. As illustrated in FIG. 4, the base 10 includes a metal portion 133 at a position within the base 10 below the focus ring 21. In the example illustrated in FIG. 4, the metal portion 133 is triangular, but the present disclosure is not limited thereto. Any other shape that may be formed through a cold spraying may be employed. For example, the metal portion 133 may be isosceles triangular, in which the two sides may have the same length of 20 mm. However, the present disclosure is not limited thereto. When the metal portion 133 is triangular, it may not be an isosceles triangle, and its side length may not be 20 mm.

Here, the metal portion 133 may be disposed in a larger amount at the side close to the coolant jacket 6 than at the side far away from the coolant jacket 6, within the base 10 at a position below the focus ring 21.

The metal portion 133 is formed through, for example, a cold spraying. For example, in the base 10, a hole is provided in advance within the base 10 at a position below the focus ring 21. Then, the metal portion 133 is formed through a cold spraying within the hole provided in the base 10, and then a metal layer formed of a metal for forming the base 10 is formed on the metal portion 133 through a cold spraying to embed the metal portion 133 within the base 10.

Here, when a gap occurs in the hole at the time of forming the metal portion 133 through a cold spraying, a screw may penetrate the gap to be fixed, by which a high-frequency voltage may flow or may be connected to the ground.

As described above, in the plasma etching apparatus according to the second exemplary embodiment, the base 10 includes the metal portion 133 at a position within the base 10 below the focus ring 21. As a result, it is possible to efficiently guide heat that is accumulated in the focus ring 21 to the coolant jacket 6, and to efficiently decrease the temperature of the focus ring 21.

That is, at the flange portion of the base 10, the focus ring 21 consisting of silicon is provided. The focus ring 21 is configured to diffuse plasma to the wafer periphery in order to make an etching characteristic at the wafer periphery uniform in the entire surface of the wafer. The temperature of the focus ring 21 is adjusted by cooling from the base 10. Here, as described above, since the base 10 is formed of a metal that has a lower thermal conductivity than aluminum, the temperature of the focus ring 21 may easily become a high temperature by heat inflow from plasma. As a result, it is thought that the etching rate at the periphery of the wafer is lower than that at the center of the wafer. Based on this, the plasma etching apparatus according to the second exemplary embodiment includes the metal portion 133 below the focus ring 21, and thus a heat transfer way from the focus ring 21 to the coolant jacket 6 is improved. As a result, etching may be uniformly performed.

In the example illustrated in FIG. 4, the plasma etching apparatus according to the second exemplary embodiment includes the metal portion 133, but the present disclosure is not limited thereto. The plasma etching apparatus may not have the metal portion 133. Also, as described above, in the above described example, the base 10 of the plasma etching apparatus according to the second exemplary embodiment is formed of the metal that has a lower thermal conductivity than aluminum, but the present disclosure is not limited thereto. For example, the base 10 of the plasma etching apparatus according to the second exemplary embodiment may be formed of aluminum.

(Third Exemplary Embodiment)

Figure 5:
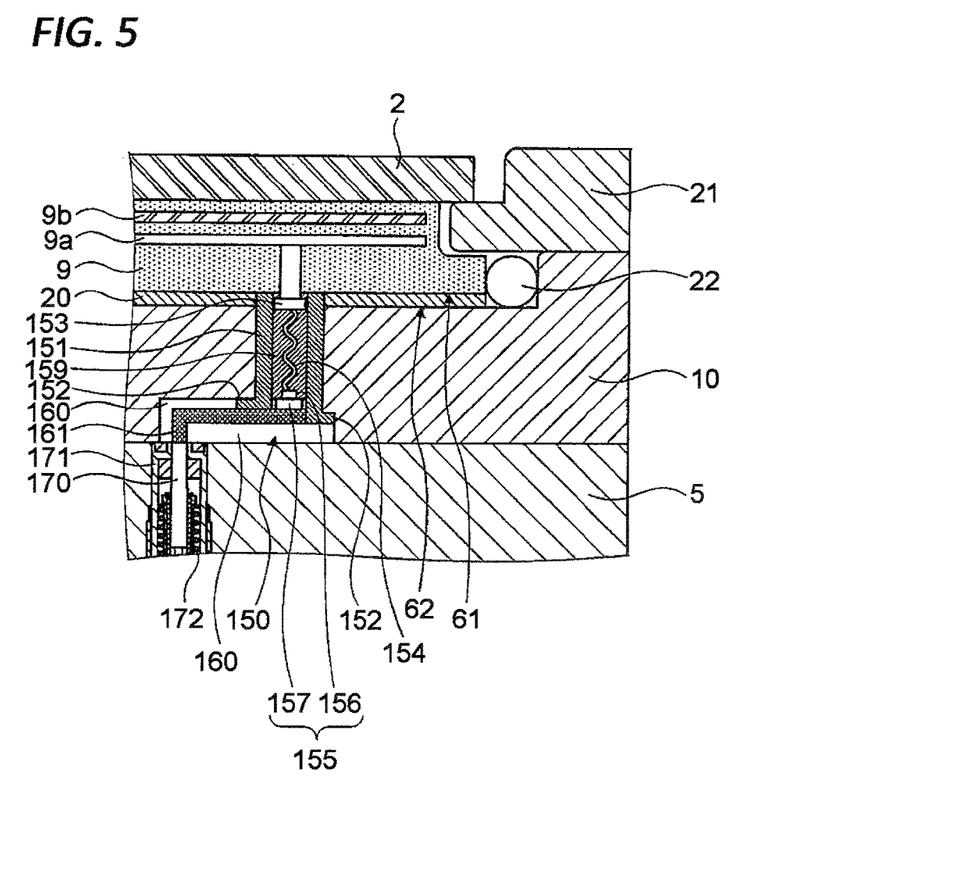
FIG. 5 is a cross-sectional view illustrating an example of an outlet port and a metal layer in a plasma etching apparatus according to a third exemplary embodiment.

A plasma etching apparatus according to a third exemplary embodiment will be described. In the plasma etching apparatus according to the third exemplary embodiment, for example, a base 10 is provided with an outlet port of a terminal that is connected to an electrode plate 9*b* or a heater 9*a* provided within an electrostatic chuck 9. The outlet port is provided with a ceramic layer formed through plasma spraying, and a wiring that includes a metal portion formed through a cold spraying.

FIG. 5 is a cross-sectional view illustrating an example of an outlet port and a metal layer in a plasma etching apparatus according to a third exemplary embodiment. In the example illustrated in FIG. 5, for convenience of illustration, unnecessary elements will be properly omitted in the description of the outlet port of the terminal connected to the heater 9a, and the metal layer in the plasma etching apparatus according to the third exemplary embodiment. For example, in FIG. 5, through holes 13a, a gas reservoir 13, and a supply pipe 14 will be omitted.

As illustrated in FIG. 5, the base 10 includes a power supply mechanism 150 that supplies electrical power to the heater 9a of the electrostatic chuck 9. A base support member 5 includes a pin shaped terminal 170. Here, the heater 9a is electrically powered through the power supply mechanism 150 from the bottom of the base support member 5 while the pin-shaped terminal 170 provided in the base support member 5 is abut on the power supply mechanism 150.

A through hole is formed in the base 10. Also, in the base 10, a space is formed which extends from the lower end of the through hole to the position on the bottom surface of the base 10, which corresponds to a position on the base support member 5 where the pin shaped terminal 170 is provided. That is, the base 10 is provided with the outlet port of the terminal connected to the heater 9a provided within the electrostatic chuck 9.

The power supply mechanism 150 includes a cylindrical member 151 that is inserted and fixed within the through hole formed in the base 10. The cylindrical member 151 is made of an insulating material. The cylindrical member 151 includes, at its lower end, a cylindrical large-diameter portion 152 that has an increased diameter. The cylindrical member 151 is positioned within the through hole by being engaged with the large-diameter portion 152 in the space that extends, from the through hole into which the cylindrical member 151 is inserted, to the position on the bottom surface of the base 10 corresponding to a position on the base support member 5 where the pin shaped terminal 170 is provided. The cylindrical member 151 is fixed within the through hole by, for example, an adhesive.

A heater-side electrode terminal 153 that is made of, for example, indium, and is bonded to the heater 9a is arranged within the cylindrical member 151 in the power supply mechanism 150. A lead wire 154 is fixed at the lower side of the heater-side electrode terminal 153, and the lower end of the lead wire 154 is fixed to a power supply side electrode terminal 155. The lead wire 154 is arranged between the heater-side electrode terminal 153 and the power supply side electrode terminal 155 while being crooked.

The power supply side electrode terminal 155 includes a small diameter portion 156 provided at the upper side, and a large-diameter portion 157 provided at the lower side. The small diameter portion 156 is inserted into the cylindrical member 151. The large-diameter portion 157 is engaged in the space that that extends, from the through hole into which the cylindrical member 151 is inserted, to the position on the bottom surface of the base 10 corresponding to a position on the base support member 5 where the pin shaped terminal 170 is provided.

Here, in order to prevent an abnormal electrical discharge from occurring between the base 10 and the lead wire 154, the diameter of the cylindrical member 151 is required to be large so as to increase the interval between the base 10 and the lead wire 154 to some extent. However, in such a configuration, the power supply mechanism 150 in its entirety is large-sized, and thus the diameter of the through hole arranged in the base 10 is required to be increased. This may cause reduction of a cooling efficiency or a temperature uniformity, and further cause reduction of an in-plane uniformity in the processing.

Based on this, in the third exemplary embodiment, a filler 159 that is made of, for example, an insulating resin is filled at the upper portion inside the cylindrical member 151. The filling of the filler 159 may securely suppress the abnormal electrical discharge from occurring between the base 10 and the lead wire 154. When the base 10 is cooled and the electrostatic chuck 9 is heated, the base 10 is contracted, and the electrostatic chuck 9 is expanded. Here, the filler 159 may be made of a resin that has a flexibility because it is applied with stress according to contraction and expansion.

Here, the base 10 includes a ceramic layer formed through plasma spraying, and a wiring having a metal portion formed through a cold spraying, in the outlet port of the terminal that is connected to the heater 9a provided within the electrostatic chuck 9. In the example illustrated in FIG. 5, the power supply mechanism 150 includes the ceramic layer 160 formed through plasma spraying and the metal portion 161 formed through a cold spraying, from the through hole into which the cylindrical member 151 is inserted, to the position on the bottom surface of the base 10 corresponding to a position on the base support member 5 where the pin shaped terminal 170 is provided. Here, the metal portion 161 is covered with the ceramic layer 160. That is, the metal portion 161 covered with the ceramic layer 160 becomes a wiring that connects the power supply side electrode terminal 155 to the pin shaped terminal 170.

The ceramic layer 160 and the wiring formed of the metal portion 161 are configured in a sandwich structure in which, for example, $Al_2O_3$ ceramic is plasma-sprayed on the base 10, the metal portion 161 is made of copper through a cold spraying to be formed as an electrode, and then $Al_2O_3$ ceramic is plasma-sprayed thereon.

The pin shaped terminal 170 will be simply described. The pin shaped terminal 170 is abut on the bottom surface of the metal portion 161. The pin shaped terminal 170 is accommodated within the cylindrical member 171 that is cylindrically formed of an insulating material. A coil spring 172 is arranged within the cylindrical member 171, and the upper end of the pin shaped terminal 170 which is biased by the coil spring 172 is pressed and abut against the bottom surface of the metal portion 161. Due to such a structure where the pin shaped terminal 170 and the metal portion 161 are pressed and abut against each other, it is possible to securely achieve an electrical connection state.

Figure 6:
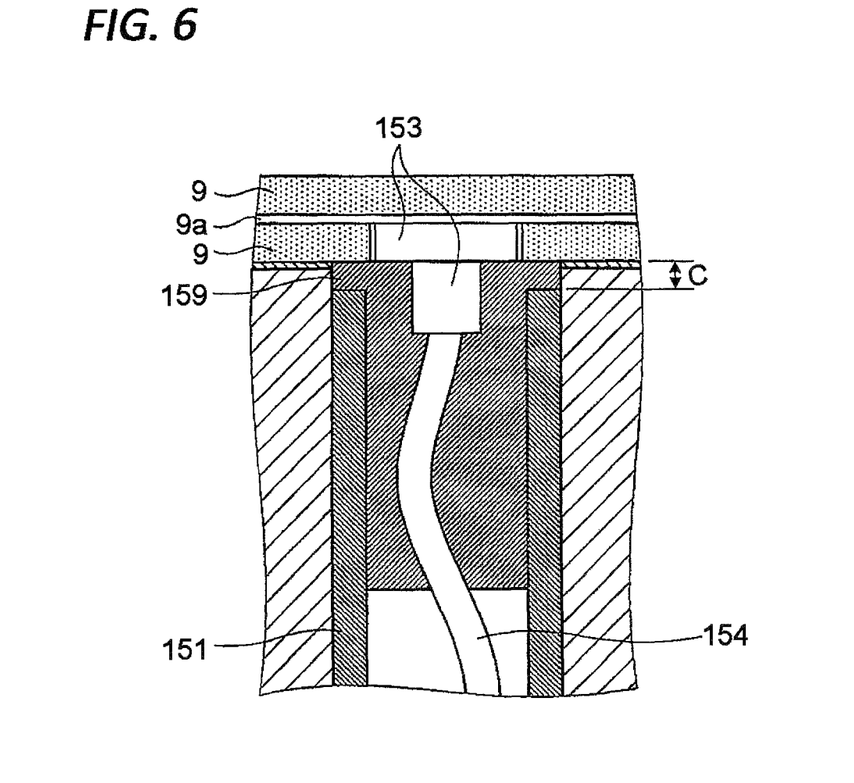
FIG. 6 is an enlarged view schematically illustrating the positional relationship between a power supply mechanism, and a base and an electrostatic chuck in the third exemplary embodiment.

FIG. 6 is an enlarged view schematically illustrating the positional relationship between the power supply mechanism, and the base and the electrostatic chuck in the third exemplary embodiment. As illustrated in FIG. 6, the upper end of the cylindrical member 151 is not in contact with the electrostatic chuck 9, and a predetermined gap C is formed between the upper end of the cylindrical member 151 and the bottom surface of the electrostatic chuck 9. The gap C may range from about 0.5 mm to 1.5 mm, and further, may be about 1 mm. The thickness of a large-diameter portion that is formed at the upper portion of the heater-side electrode terminal 153 may be set as a thickness (for example, from about 0.5 mm to 1.0 mm) that does not extend downwardly from the bottom surface of the electrostatic chuck 9.

The filler 159 that is filled within the cylindrical member 151 is also filled within the gap C formed between the upper end of the cylindrical member 151 and the bottom surface of the electrostatic chuck 9. When expansion of the electrostatic chuck 9 and contraction of the base 10 occur, the filler 159 filled within the gap C is deformed so as to absorb stress caused by deformation due to the expansion and contraction.

In the example illustrated in FIG. 6, the lead wire 154 in its entirety is meandered, but the present disclosure is not limited thereto. Another configuration where a portion accommodated within the filler 159 is linear, and a portion positioned outside the filler 159 is meandered may be employed. In this manner, when the portion of the lead wire 154 which is accommodated within the filler 159 is linear in shape, a distance from the base 10 to the lead wire 154 may be maintained at maximum in the linear portion. As a result, it is possible to further reduce the possibility that an abnormal electrical discharge occurs in the interval between the base 10 and the lead wire 154.

In the above described example, the heater 9a is exemplified, but the present disclosure is not limited thereto. The electrode plate 9b provided within the electrostatic chuck 9 may be configured in the same manner. That is, in the example illustrated in FIG. 1, the electrode plate 9b is connected to one end side of the conductive wire 25, and the other end side of the conductive wire 25 is connected to the power feeding rod 26, but the electrode plate 9b may be connected in the same manner as the heater 9a.

In the example illustrated in FIG. 1, when viewed in the vertical direction of the plasma etching apparatus 100, the conductive wire 25 and the power feeding rod 26 are provided at the same position. That is, in the example, the conductive wire 25 and the power feeding rod 26 continuously penetrate the base 10 and the base support member 5 in the vertical direction. However, the present disclosure is not limited thereto. The position on the base 10 where the conductive wire 25 is provided may not correspond to the position on the base support member 5 where the power feeding rod 26 is provided. In this case, as described above, the same power supply mechanism as in the heater 9a may be used to connect the conductive wire 25 to the power feeding rod 26.

As described above, in the plasma etching apparatus 100 according to the third exemplary embodiment, the base 10 is provided with the outlet port of the terminal that is connected to the electrode plate or the heater provided within the electrostatic chuck 9. Further, the outlet port includes the ceramic layer 160 formed through plasma spraying, and the wiring having the metal portion 161 formed through a cold spraying. As a result, even at offset (extension portion of the wiring) of the power feeding portion to the heater 9a, an adhesive may be suppressed from being peeled off at the extension portion of the wiring.

In the space that extends, from the lower end of the through hole, to the position on the bottom surface of the base 10 corresponding to a position on the base support member 5 where the pin shaped terminal 170 is provided, the wiring may be more securely and simply prepared, as compared to a technique of separately fabricating the cylindrical member 151. That is, it takes a time to make a cylindrical member through shaving along the space that extends to the position corresponding to the position where the pin shaped terminal 170 is provided. When the cylindrical member is made and fixed by an adhesive, the adhesive may be deteriorated, and the adhesion may be insufficiently carried out. In contrast, according to the third exemplary embodiment, since the wiring is integrally formed through plasma spraying or a cold spraying, a gap hardly occurs, thereby reducing the possibility of troubles. Thus, it is possible to make the wiring with a high precision.

(Other Exemplary Embodiments)

As described above, the plasma etching apparatus and the control method according to the first exemplary embodiment to the third exemplary embodiment have been described, but the present disclosure is not limited thereto. Hereinafter, other exemplary embodiments will be described.

For example, the metal portion 130 and the metal portion 133 may be provided while being divided in plural portions. For example, the metal portions may be provided while being divided in plural portions in a vertical direction, a horizontal direction, or any other direction. Such division may disperse the load caused by expansion or contraction of the metal portion 130 or the metal portion 133.

For example, the metal portion 130 may be provided in a larger amount at the position corresponding to the edge of the electrostatic chuck 9 than at the position corresponding to the center of the electrostatic chuck 9, within the base 10 at a position below the electrostatic chuck 9.

For example, the metal portion 130 may be provided only at a position corresponding to the edge of the electrostatic chuck 9, on a position below the electrostatic chuck 9.

For example, the metal portion 130 or the metal portion 133 may be provided to connect the electrostatic chuck 9 or the focus ring 21 to the coolant jacket 6, such that heat may be efficiently guided to the coolant jacket 6.

That is, the peripheral end of the semiconductor wafer protrudes from the electrostatic chuck 9. As a result, the temperature of the peripheral end of the semiconductor wafer may be higher than that of the central portion. Based on this, the metal portion 130 may be provided in a larger amount at the peripheral end than at the position corresponding to the center of the electrostatic chuck 9, thereby more easily guiding the temperature at the peripheral end of the semiconductor wafer than at the central portion to the coolant jacket 6. This may allow the temperature of the semiconductor wafer to be further uniform.

For example, the metal portion may be provided in the base support member 5 as well as the base 10.

In the above described exemplary embodiments, the metal portion is formed through a cold spraying by using a metal that has a higher thermal conductivity than the metal for forming the base 10, but the present disclosure is not limited thereto. For example, the metal portion may be formed of a metal that has a lower thermal conductivity than the metal for forming the base 10. For example, when the base is formed of titanium, a metal that has a lower thermal conductivity than titanium may be used. Examples of the metal that has a lower thermal conductivity than titanium include a mixture of zirconia and yttria, and an alloy of nickel and chrome. Further, porcelain or glass may be used. When the base is formed of aluminum, a metal that has a lower thermal conductivity than aluminum may be used for forming the metal portion.

The thermal conductivity required for the base 10 varies according to the plasma etching apparatus. The case of lowering the thermal conductivity of the base 10 is also assumed. Based on this, the base 10 may be embedded with a metal portion that is formed through a cold spraying using a metal that has a higher thermal conductivity than the metal for forming the base 10, thereby lowering the thermal conductivity of the base 10. Other features of the metal portion formed through a cold spraying using the metal that has a higher thermal conductivity than the metal for forming the base 10 are the same as those in the metal portion 130 or the metal portion 133, and their description is omitted.

Each of the first to third exemplary embodiments and other exemplary embodiments as described above may be realized in combination with other exemplary embodiments within a range not causing contradiction, or may be realized alone without combination with other exemplary embodiments.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma etching apparatus, comprising:
    a base of a first metal that has a lower expansion coefficient than aluminum;
    an electrostatic chuck disposed over the base and configured to mount an object to be processed;
    a bonding layer between the base and the electrostatic chuck, the bonding layer bonding the base and the electrostatic chuck; and
    a heater provided within the electrostatic chuck,
    wherein the base includes:
        (i) a cylindrical recess,
        (ii) a metal portion of a second metal embedded beneath the cylindrical recess, wherein the second metal has a higher thermal conductivity than the first metal, and
    wherein the metal portion is surrounded by the first metal,
    wherein the base includes a through hole at a center thereof, a surface of the through hole is covered by an elastic member with an insulating layer interposed between the elastic member and the base, the elastic member is in direct contact with the electrostatic chuck, and the metal portion of the second metal extends substantially beyond an outer periphery of the electrostatic chuck.

2. The plasma etching apparatus of claim 1, wherein the bonding layer includes a brazing metal.

3. The plasma etching apparatus of claim 1, wherein the metal portion is at a position within the base below the electrostatic chuck.

4. The plasma etching apparatus of claim 1, further comprising a focus ring,
    wherein the metal portion is at a position within the base below the focus ring.

5. The plasma etching apparatus of claim 1, wherein the base is provided with an outlet port of a terminal that is connected to an electrode plate or the heater provided within the electrostatic chuck, and the outlet port is provided with a ceramic layer and a wiring having a metal portion.

6. The plasma etching apparatus of claim 1, wherein the first metal includes at least one of titanium, kovar, invar, usper invar, and nobinite.

7. The plasma etching apparatus of claim 1, wherein the second metal includes at least one of silver, copper and aluminum.

8. The plasma etching apparatus of claim 1, wherein the electrostatic chuck includes a ceramic, and is provided with a metal film at a portion to which the bonding layer is bonded.

9. The plasma etching apparatus of claim 1, wherein the metal portion is divided in plural portions.

10. The plasma etching apparatus of claim 1, wherein the metal portion is provided in a larger amount at a position corresponding to an edge of the electrostatic chuck than a position corresponding to a center of the electrostatic chuck, and wherein the metal portion is at a position within the base below the electrostatic chuck.

11. The plasma etching apparatus of claim 1, wherein the metal portion is provided only at a position corresponding to an edge of the electrostatic chuck, and wherein the metal portion is at a position below the electrostatic chuck.

12. The plasma etching apparatus of claim 1, wherein the base comprises a peripheral convex portion surrounding the cylindrical recess.

13. The plasma etching apparatus of claim 12, further comprising:
    a sealant which contacts at least two of a side surface of the electrostatic chuck, a side surface of the peripheral convex portion and an upper surface of the base.

14. The plasma etching apparatus of claim 13, further comprising:
    a focus ring,
    wherein the sealant is located beneath the focus ring.

15. The plasma etching apparatus of claim 13, further comprising:
    a sprayed film which covers the upper surface of the base and the side surface of the peripheral convex portion such that the sealant contacts at least one of the side surface of the peripheral convex portion and the upper surface of the base with the sprayed film interposed therebetween.

16. The plasma etching apparatus of claim 12, further comprising:
    another metal portion embedded in the peripheral convex portion.

17. The plasma etching apparatus of claim 16, wherein the another metal portion has a triangular cross section.

* * * * *